United States Patent [19]

Fisher et al.

[11] Patent Number: 4,728,809

[45] Date of Patent: Mar. 1, 1988

[54] PULSE CIRCUIT FOR SWITCHING A GRID ELECTRODE OF AN ELECTRON BEAM GENERATOR

[75] Inventors: Frank D. Fisher; Ronald Ovens, both of Edinburgh, Scotland

[73] Assignee: Ferranti, Plc, Cheadle, England

[21] Appl. No.: 933,975

[22] Filed: Nov. 24, 1986

[30] Foreign Application Priority Data

Dec. 6, 1985 [GB] United Kingdom ............... 8530081

[51] Int. Cl.$^4$ ............................................. H03K 3/00
[52] U.S. Cl. .................................................. 307/106
[58] Field of Search ............... 307/106, 571, 572, 262, 307/263

[56] References Cited

U.S. PATENT DOCUMENTS 2,850,832  9/1958  Kreutzer ............................ 307/106
3,980,895  9/1976  Schrader ........................... 307/106

*Primary Examiner*—Bernard Roskoski
*Attorney, Agent, or Firm*—Dennis P. Clarke

[57] ABSTRACT

A pulse circuit is provided for switching a grid electrode of an electron beam generator having a cathode electrode at a very high potential relative to ground. The grid electrode is to be switched between two control voltages (+V, −V) of opposite polarity by first and second switching devices (TS1, TS2) each operable to connect one of the control voltages to the grid electrode. A pair of control devices (TC1, TC2) is provided, each associated with a separate one of the switching devices (TS1, TS2) and operable to switch off the associated switching device. A first pulse transformer (TR1, TR2) is provided having a primary winding to which pulses may be applied substantially at ground potential and a secondary winding operating at the potential of the cathode. A pulse amplifier (TA1-TA2, TA3-TA4) is connected between that secondary winding and the primary winding of a second or third pulse transformer (TR2, TR3). Each of these has two secondary windings one of which is connected to one of the switching devices (TS1, TS2) whilst the other is connected to the control device (TC1, TC2) associated with the other switching device. The application of a pulse to the first pulse transformer causes the grid electrode to be disconnected from the control voltage of one polarity and connected to the control voltage of the opposite polarity.

3 Claims, 2 Drawing Figures

PULSE CIRCUIT FOR SWITCHING A GRID ELECTRODE OF AN ELECTRON BEAM GENERATOR

This invention relates to pulse circuits for switching a grid electrode of an electron beam source having a cathode electrode at a very high potential relative to ground. Particularly, though not exclusively, it relates to a pulse modulation circuit for a microwave power source such as a travelling-wave tube.

Travelling-wave tubes are used to generate pulses of energy for radar transmitters and similar purposes and operate by switching the potential of a grid electrode of the tube between two voltages of opposite polarity relative to the cathode potential of the tube. When the grid is switched to one polarity the flow of electron beam current in travelling-wave tube is possible, whilst when the grid is switched to the opposite polarity the electron beam current is inhibited.

Travelling-wave tubes require very high operating potentials and in particular the cathode electrode is usually at a high negative potential with respect to ground, say between $-10$ kV and $-30$ kV. The voltage applied to the grid electrode to effect control is relatively small compared to the cathode potential, say 200 volts to 400 volts of either polarity relative to the cathode. The result of this, however, is that the grid is also at a high negative potential relative to ground.

In order to produce the necessary control voltage on the grid electrode a switching circuit is required, operated by control pulses. Two conflicting requirements occur, one being the need to provide adequate voltage isolation to allow pulses at or around ground potential to be applied to the switching circuit. The other requirement is the ability to provide rapid switching of the grid electrode to give fast pulse rise and fall times. Existing solutions to this conflict result in the use of large pulse transformers to provide the voltage isolation and the inability to provide the necessary sharp pulses.

It is an object of the invention to provide a pulse circuit for switching a grid electrode of an electron beam generator which overcomes the above-mentioned problems.

According to the present invention there is provided a pulse circuit for switching a grid electrode of an electron beam generator having a cathode electrode at a very high potential relative to ground between two control voltages of opposite polarity, which circuit includes first and second switching devices each operable to connect one of the control voltages to the said grid electrode, first and second control devices each associated with a separate one of the switching devices and operable to switch off the said switching devices, a first pulse transformer having a primary winding to which may be applied pulses substantially at ground potential and a secondary winding operating at the potential of the cathode electrode, a pulse amplifier connected to the said secondary winding, and second and third pulse transformers each having a primary winding connected to the output of the pulse amplifier and a pair of secondary windings one being connected to one of said switching devices and the other being connected to the control device associated with the other of said switching devices, the arrangement being such that the application of a suitable pulse to the primary winding of the first pulse transformer causes the said grid electrode to be disconnected from the control voltage of one polarity and connected to the control voltage of the opposite polarity.

The invention will now be described with reference to the accompanying drawings, in which.

Figure 1:
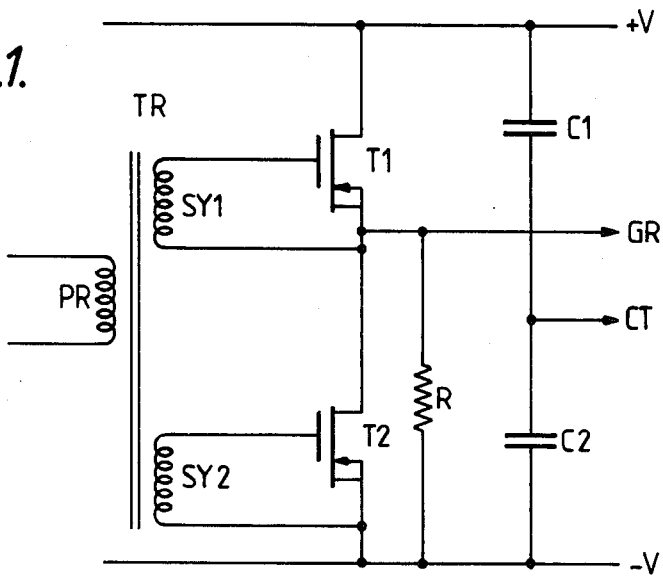
FIG. 1 is a schematic circuit diagram of a known pulses circuit.

Referring now to FIG. 1, a conventional circuit comprises a single pulse transformer TR having a primary winding PR and two secondary windings SY1 and SY2. The primary winding is connected to the pulse source (not shown) whilst each secondary winding is connected across the gate-source junction of a separate one of two series-connected MS power transistors T1 and T2. The junction between the two transistors is connected to the grid GR of a travelling-wave tube whilst the collector of transistor T1 is connected to the positive grid voltage $+V$. Similarly the emitter of the transistor T2 is connected to the negative grid voltage $-V$. A capacitive divider comprising two capacitors C1 and C2 is connected between the voltages $+V$ and $-V$, with the cathode CT of the travelling-wave tube and the $+V$ and $-V$ returns connected to the junction of the two capacitors. By way of example the cathode potential may be $-10$ kV with respect to ground whilst $+V$ is 200 volts and $-V$ is $-200$ volts, both with respect to the cathode CT.

The pulse transformer TR must be capable of isolating the pulse source at around ground potential from the secondary windings at around $-10$ kV as well as passing the current needed to charge and discharge the gate to source capacitance of the two transistors T1 and T2. For the shortest pulse rise and fall times the leakage inductance of the transformer should be as low as possible. On the other hand, this conflicts with the voltage isolation requirement which will tend to increase the leakage inductance. The usual solution is to use an oversize core in the construction of the pulse transformer. This results in the disadvantages already specified.

The maximum pulse length achievable with such an arrangement is determined by the time taken to saturate the core of the pulse transformer. In practical systems pulses between 20 $\upsilon$S and 100 $\upsilon$S duration may be achieved. However, if longer pulse durations are required then the size of the transformer becomes excessive.

In operation a pulse of one polarity applied to the primary winding of the pulse transformer switches one of the transistors on and the other off. Similarly, a pulse of the opposite polarity reverses the situation.

Figure 2:
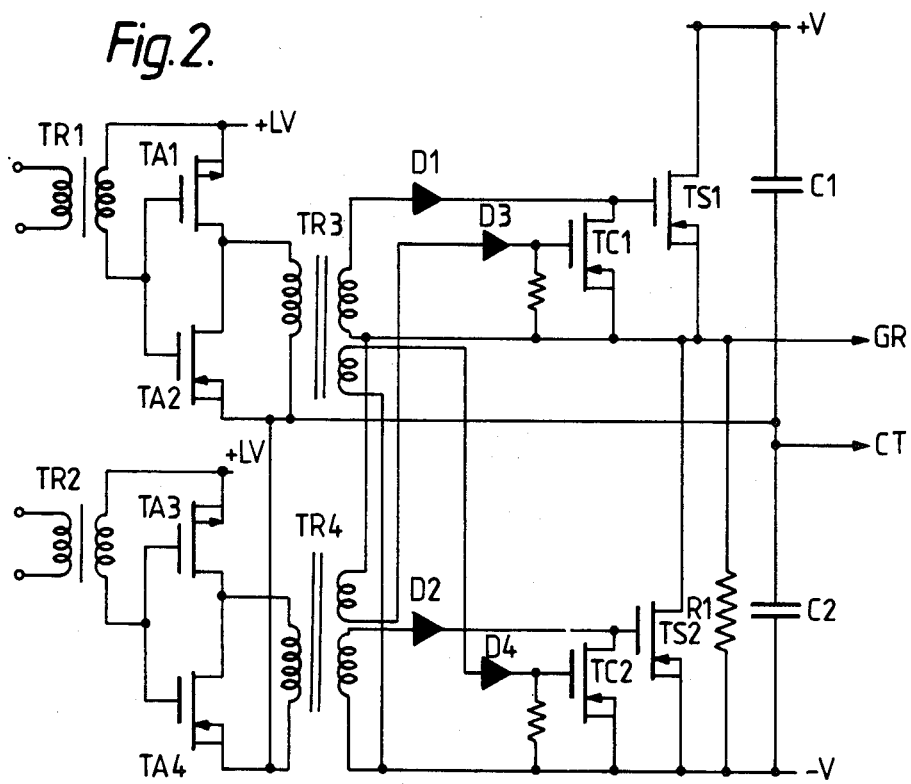
FIG. 2 is a schematic circuit diagram according to an embodiment of the invention.

FIG. 2 shows a circuit diagram of a pulse circuit which still provides the necessary voltage isolation but also permits much faster rise and fall times to be achieved. From FIG. 2 it will be seen that the single pulse transformer is now replaced by two separate identical transformers TR1 and TR2 each having a primary winding and a secondary winding with adequate insulation to withstand the voltages applied to the travelling-wave tube. The secondary winding of transformer TR1 is connected to a pulse amplifier made up of a pair of transistors TA1 and TA2 connected to a low voltage supply $+LV$, referred to the cathode potential of the travelling-wave tube. This pulse amplifier drives the primary winding of a further pulse transformer TR3, which need only be insulated to withstand the magnitude of the voltages $+V$ and $-V$.

In a similar manner the secondary winding of pulse transformer TR2 is connected to a second pulse amplifier comprising transistors TA3 and TA4 driving the primary winding of another pulse transformer TR4. Transformers TR3 and TR4 are identical.

Pulse transformer TR3 has two secondary windings, one of which is connected through a diode D1 across the gate-source junction of a power MS transistor TS1. One of two secondary windings of pulse transformer TR4 is likewise connected through a diode D2 across the gate-source junction of a second MOS power transistor TS2. The drain of transistor TS1 is connected to the positive switching voltage +V and the source of transistor TS2 to the negative switching voltage −V. The source of TS1 and the drain of TS2 are connected together and to the grid GR of a travelling-wave tube (not shown).

Switching transistor TS1 has a control MOS transistor TC1 connected across its gate-source junction. Across the gate-source junction of transistor TC1 is connected the second secondary winding of pulse transformer TR4 through a diode D3. Similarly, the second secondary winding of pulse transformer TR3 is connected through a diode D4 across the gate-source junction of an MOS transistor TC2 which is itself connected across the gate-source junction of switching transistor TS2.

A capacitive divider comprising capacitors C1 and C2 is connected between supply voltages +V and −V with the centre point connected to the return of these supplies and also to cathode CT of the travelling-wave tube.

The operation of the circuit shown in FIG. 2 is as follows:

Assume first that the grid GR of the travelling-wave tube is held at −V with respect to the cathode by the pull-down resistor R1. A short pulse is applied to the primary winding of pulse transformer TR1, and the pulse induced in the secondary winding causes transistor TA1 to turn on and TA2 to turn off. Sine the pulse amplifier is run from a low voltage power supply the gate-source capacitance of transistors TA1 and TA2 is small and pulses as short as 100nS or less may be used without difficulty. Pulse transformer TR1 is able to provide adequate primary to secondary winding isolation between ground and the cathode potential, and, due to the narrow pulses being used, may be very small. The output of the pulse amplifier comprising transistors TA1 and TA2 drives the pulse transformer TR3, the secondary winding of which drives the gate of transistor TS1 via diode D1. Because the pulses are very short and because transformer TR3 does not have to provide EHT isolation this transformer may be designed purely for high-speed pulse operation. The gate-source capacitance of transistor TS1 is rapidly charged up and the transistor turns on. Diode D1 prevents this charge from leaking away after the short pulse has terminated, and so transistor TS1 remains on. At the same time the other secondary winding of transformer TR3 turns on transistor TC2. This short-circuits the gate-source junction of transistor TS2 and keeps TS2 off. Hence the grid of the travelling-wave tube is now connected to the +V supply.

In order to reverse the process a short pulse is applied to pulse transformer TR2. This causes transistors TS1 and TC2 to be turned off and TS2 and TC1 to be turned on in exactly the same way as before, rapidly pulling the grid of the travelling-wave tube back to the −V supply.

The maximum pulse length that may be achieved with this new arrangement is determined only by the leakage of charge from the gate-source capacitances of the power MOS transistors. Pulse lengths in excess of 0.55 are readily achieved.

Although the circuit described above requires four separate pulse transformers, these may be very small as the conflicting requirements of the prior art circuit have been overcome.

It might appear that the number of pulse transformers may be reduced by, for example, combining transformers TR3 and TR4 into one. However, it is necessary that the two are kept separate to avoid any false operation of the circuit. However, some modification of the circuit may be possible without departing from the main aspects of the invention.

The above description has been written with reference to a travelling-wave tube. However, the invention may be applied to other forms of grid-controlled electron beam generator, such as the reflex klystron.

What we claim is:

1. A pulse circuit for switching a grid electrode of an electron beam generator having a cathode electrode at a very high potential relative to ground between two control voltages of opposite polarity, which circuit includes first and second switching devices each operable to connect one of the control voltages to the said grid electrode, first and second control devices each associated with a separate one of the switching devices and operable to switch off the said switching devices, a first pulse transformer having a primary winding to which may be applied pulses substantially at ground potential and a secondary winding operating at the potential of the cathode electrode, a pulse amplifier connected to the said secondary winding, and second and third pulse transformers each having a primary winding connected to the output of the pulse amplifier and a pair of secondary windings one being connected to one of said switching devices and the other being connected to the control device associated with the other of said switching devices, the arrangement being such that the application of a suitable pulse to the primary winding of the first pulse transformer causes the said grid electrode to be disconnected from the control voltage of one polarity and connected to the control voltage of the opposite polarity.

2. A circuit as claimed in claim 1 which includes two of said first pulse transformers each connected through a separate pulse amplifier to one of said second and third pulse transformers.

3. A circuit as claimed in claim 1 in which said switching devices and said control devices are transistors.

* * * * *